United States Patent [19]
Murotani

[11] Patent Number: 5,120,664
[45] Date of Patent: Jun. 9, 1992

[54] METHOD OF MAKING AN INFRARED IMAGING DEVICE

[75] Inventor: Toshio Murotani, Itami, Japan

[73] Assignee: Mitsubishi Danki Kabushiki Kaisha, Japan

[21] Appl. No.: 716,937

[22] Filed: Jun. 18, 1991

Related U.S. Application Data

[62] Division of Ser. No. 483,653, Feb. 23, 1990, Pat. No. 5,034,794.

[30] Foreign Application Priority Data

May 30, 1989 [JP] Japan ................... 1-138591

[51] Int. Cl.$^5$ ............................................. H01L 27/14
[52] U.S. Cl. ......................................... 437/2; 437/3; 437/5; 437/90
[58] Field of Search ............... 437/2, 3, 5, 90, 126, 437/133; 357/17, 4, 16, 30 B, 30 D, 30 E, 30 H, 30 I, 22 A, 22 MD, 58

[56] References Cited

U.S. PATENT DOCUMENTS

| | | | |
|---|---|---|---|
| 4,722,907 | 2/1988 | Weil et al. | 437/133 |
| 4,782,223 | 11/1988 | Suzuki | 250/214 R |
| 4,829,013 | 5/1989 | Yamazaki | 437/5 |
| 4,833,511 | 5/1989 | Sugimoto | 357/19 |
| 4,894,526 | 1/1990 | Bethea et al. | 250/211 R |
| 4,922,218 | 5/1990 | Watanabe et al. | 357/30 |
| 5,026,148 | 6/1991 | Wen et al. | 350/386 |
| 5,034,794 | 7/1991 | Murotani | 357/4 |

FOREIGN PATENT DOCUMENTS 62-190780  8/1987  Japan.
63-158882  7/1988  Japan.

OTHER PUBLICATIONS

Levine et al., "InGaAs/InAlAs Multiquantum Well Intersubband Absorption At a Wavelength of λ=4.4 μm", Applied Physics Letters, vol. 52, No. 18, 1988, pp. 1481-1483.

Levine et al., "New 10 μm Infrared Detector Using Intersubband Absorption In Resonant Tunneling GaAlAs Superlattices", Applied Physics Letters, vol. 50, No. 16, 1987, pp. 1092-1094.

Levine et al., "High-detectivity D*... Infrared Detector", Applied Physics Letters, vol. 53, No. 4, 1988, pp. 296-298.

Primary Examiner—Olik Chaudhuri
Assistant Examiner—M. Wilczewski
Attorney, Agent, or Firm—Leydig, Voit & Mayer

[57] ABSTRACT

An infrared imaging device includes an infrared detector element having a pin structure which detects infrared rays 8 to 12 macrons in wavelength. The pin structure comprises a multiquantum well structure as an intrinsic layer including a plurality of $Al_yGa_{1-y}As$ quantum well layers sandwiched by respective $Al_xGa_{1-x}As$ quantum barrier layers ($x>y$) and a p type $Al_xGa_{1-x}As$ layer and an n type $Al_xGa_{1-x}As$ layer sandwiching the intrinsic layer. An infrared imaging device includes a plurality of picture units, each picture unit including an infrared detector element and a corresponding GaAs FET having a source region connected with the n layer of the infrared detector element on the same substrate. The picture unit and corresponding FET may be monolithically integrated on the same substrate with an n type channel in the substrate interconnecting the picture unit and the corresponding FET.

6 Claims, 8 Drawing Sheets

METHOD OF MAKING AN INFRARED IMAGING DEVICE

This application is a division of application Ser. No. 07/483,653, filed Feb. 23, 1990, now U.S. Pat. No. 5,034,794.

FIELD OF THE INVENTION

The present invention relates to an infrared imaging device and a production method thereof. More particularly, the invention relates to an infrared detector element for detecting infrared rays of 8 to 12 microns wavelength which transmit the air.

BACKGROUND OF THE INVENTION

Generally, there is a relationship between energy and wavelength of a phonon as represented by the following formula. That is, semiconductor material having an energy band gap Eg (eV) is sensitive to the light of wavelength $\lambda$ ($\mu$m), $$\lambda = \frac{1.24}{Eg}.$$

$Hg_{0.8}Cd_{0.2}Te$ has an energy band gap of about 0.1 eV and it has been employed as semiconductor material which can absorb infrared rays of 8 to 12 microns wavelength. However, this material will be vaporized at about 100° C. because Hg is volatile material having high evaporation pressure. Therefore, handling of Hg in a crystal growth process and also in a wafer process is difficult, and this has been an obstruction to development of the technique. Thus, this results in such a difficulty in a production process that the number of picture elements in an imaging device is subjected to a restriction.

On the other hand, research of material such as GaAs which is III-V group compound semiconductor is recently advancing. As an infrared detector element having a sensitivity comparative to that of above-described HgCdTe, one utilizing a multi-quantum well (hereinafter referred to as "MQW") is expected.

FIG. 8 is a cross-sectional view showing an MQW infrared detector element recited in Appl. Phys. Lett., Vol. 50, No. 16, April 1987, pp 1092-1094. In FIG. 8, reference numeral 1 designates a semi-insulating GaAs substrate. An $n^+$-GaAs contact layer 2 is epitaxially grown on semi-insulating GaAs substrate 1 to a thickness of about 1 micron. Reference numeral 3 designates an AlGaAs-GaAs MQW structure. This AlGaAs-GaAs MQW structure 3 comprises fifty single quantum wells each comprising two $Al_{0.31}Ga_{0.69}As$ barrier layers 3b of 300 angstroms thickness and a GaAs quantum well layer 3a of 40 angstroms thickness sandwiched by the barrier layers 3b. The total thickness is 1.73 microns. This is produced on the $n^+$ type GaAs layer 2 by using an MOCVD method or MBE method. An $n^+$-GaAs contact layer 4 is produced on the AlGaAs-GaAs MQW structure 3. Reference numerals 12 and 14 designate electrodes. Reference numeral 21 designates an infrared entrance window which is produced by polishing the face of semi-insulating GaAs substrate at an angle of 45 degree. Reference numeral 31 designates infrared rays of 8 to 12 microns wavelength. Reference numeral 27 designates an infrared detector element.

Now, at the ground state of n=1, an electron distribution has a peak at the center of GaAs quantum well layer 3a. On the other hand, at the excited state of n=2, an electron distribution has a peak at the neighborhood of interface between the GaAs quantum well layer 3a and the AlGaAs barrier layer 3b, thereby arising a dipole moment in the direction perpendicular to the layers due to the optical transition. Among the electric fields of electromagnetic wave (infrared rays), only the electric field component parallel with the dipole moment interacts with the dipole moment. However, the electric field of the infrared rays perpendicularly incident to the MQW structure 3 is shifted perpendicular to the incident direction, that is, parallel with the MQW layer 3. Therefore, the electric field does not interact with the dipole moment and there arises no light absorption at the MQW layer 3.

In order to generate absorption of incident light at the MQW layer 3, the infrared rays is required to be incident to the MQW layer 3 in parallel or in an oblique direction. However, in order to make the infrared rays incident to the MQW layer 3 in parallel, the light has to be incident from the side face of substrate 1. This results in an obstruction to the integration of elements. In the element of FIG. 8, the face of substrate 1 is polished at an angle of 45 degree, and the infrared rays 31 is obliquely incident to the MQW layer 3 from the window 21.

While the refractive index of air $n_1$ is 1, the refractive index of semiconductor $n_2$ is quite high, as is about 4. Therefore, the infrared rays 31 incident to the entrance window 21 in all directions is incident approximately perpendicular to the polished surface due to the refraction of the rays. Therefore, the infrared rays 31 is incident to the MQW layer 3 at an angle of 45 degree, and about half of incident light has an electric field component parallel with the dipole moment of MQW layer 3, whereby about half of incident light is absorbed.

The operation of the MQW infrared detector element will be described.

FIGS. 9a and 9b show an energy band diagram of an AlGaAs-GaAs MQW structure 3. Herein, the electric field is applied to the MQW structure 3. Electrons locally exist at the neighborhood of GaAs quantum well 3a and the energies of electrons are quantized, i.e., the electrons have discrete energies. The energies are obtained from the following formula, assuming the bottom of GaAs conduction band as a reference.

$$En = \frac{h^2}{2m^*}\left(\frac{n\pi}{L_w}\right)^2$$

where n is an integer (n > 1), h is Plank's constant, $m^*$ is effective mass of electron, and $L_w$ is thickness of GaAs quantum well layer 3a.

Herein, n=1 represents the ground level and n=2 represents an excited level. The thickness $L_w$ of GaAs quantum well layer is selected such that the excited level n=2 is equal to the conduction band level of AlGaAs layer 3b. The energy $\Delta E$ required for excitation from the state n=1 to n=2 is about 0.1 eV. That is, the optical transition from the state of n=1 to n=2 is caused by the incidence of infrared rays of 10 microns wavelength, and the infrared rays is absorbed corresponding to the optical transition. The excited electrons are able to move in the AlGaAs-GaAs MQW structure 3 by the electric field and will contribute to the electric conductivity. The infrared detector element of FIG. 8 is a photo-conducting type one utilizing change of conductivity due to infrared rays absorption.

FIG. 10 shows a bias circuit for detecting change of resistance of infrared detector element of FIG. 8.

As described above, the infrared detector element 27 is a photo conducting type one, and the resistivity of crystal changes due to the incidence of light. Therefore, when the change of the voltage between the terminals 30a and 30b is measured in a state where a resistor 28 having a sufficiently high resistance with relative to the element 27 is connected with the voltage power supply 29 in series thereto, and a constant current is made flow, the amount of light which is incident to the infrared detector element 27 is detected.

In the prior art MQW infrared detector element of such construction, in order to occur absorption of light, the infrared rays 31 is required to be incident from the infrared entrance window 21 which is produced by polishing the substrate 1 in a diagonal direction, and the infrared rays cannot be incident from the main surface or rear surface of semiconductor. Therefore, it is quite difficult to constitute an infrared imaging device by integrating a plurality of infrared detector elements. Furthermore, since the prior art infrared detector element is a photo-conducting type one, such as a bias circuit is required to detect the infrared rays, thereby resulting in a complicated circuit. Therefore, such infrared detector element is inconvenient to the construction of infrared imaging circuit.

SUMMARY OF THE INVENTION

It is an object of the present invention to provide an infrared imaging device capable of conducting an incidence of infrared rays from either of main surface and rear surface of semiconductor, and superior in the matching with an imaging circuit as a photo-voltaic type imaging element of a pin structure.

It is another object of the present invention to provide a method for producing such a device.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a pin type infrared detector element for detecting infrared rays of 8 to 12 microns wavelength band is constituted by an i layer of multi-quantum well structure in which a plurality of $Al_yGa_{1-y}As$ quantum well layers are sandwiched by a plurality of $Al_xGa_{1-x}As$ layers ($x>y$) (hereinafter referred to as "AlGaAs-MQW structure"), and a p-$Al_xGa_{1-x}As$ layer and an n-$Al_xGa_{1-x}As$ layer provided sandwiching the i layer therebetween. This makes it quite easy to constitute an infrared imaging circuit by integrating a plurality of infrared detector elements.

According to a second aspect of the present invention, a pin photodiode having an i layer of AlGaAs-MQW structure, which detects the infrared rays of 8 to 12 microns wavelength band and a source of GaAs FET are connected to each other by an n type ion implantation layer and integrated with each other, thereby to constitute an imaging unit of an infrared imaging device. Therefore, the infrared rays can be incident to the device from the front surface or rear surface of substrate, thereby enabling to produce an infrared imaging element of high integration density.

According to a third aspect of the present invention, a pin photodiode having an i layer of AlGaAs-MQW structure which detects infrared rays of 8 to 12 microns wavelength band is constituted on a plurality of facets having an angle of $45 \pm 15$ degree with respect to the main face of GaAs substrate produced on the substrate. Therefore, the infrared rays can be incident to the device from the front surface or rear surface of substrate, thereby enabling to produce an infrared imaging element at a high integration density.

According to a fourth aspect of the present invention, a pin photodiode having an i layer of AlGaAs-MQW structure for detecting an infrared rays of 8 to 12 microns wavelength band is constituted on a plurality of facets having an angle of $45 \pm 15$ degree with respect to the main face of GaAs substrate produced on the substrate and the pin photodiode are combined to the source region of GaAs FET by an n type ion implantation layer, thereby producing an imaging unit of an infrared imaging device, and the infrared rays is made incident from the front surface or the rear surface of substrate. Therefore, the infrared detector element and the GaAs FET can be monolithically integrated on the semi-insulating GaAs substrate with connecting the n layer of element and the source of FET, and a scanning circuit comprising the detector element and the GaAs FET can be easily obtained.

According to a fifth aspect of the present invention, a pin photodiode having an i layer of AlGaAs-MQW structure for detecting the infrared rays of 8 to 12 microns wavelength band is constituted on a main surface of GaAs substrate and a source of GaAs FET are connected to the pin photodiode by an n type ion implantation layer, thereby producing an imaging unit of an infrared imaging device. Furthermore, a plurality of facets having an angle of $45 \pm 15$ degree with respect to the surface of GaAs substrate is produced on the rear surface of GaAs substrate. Therefore, the infrared rays can be obliquely incident to the device from the rear surface, thereby enabling to produce an infrared imaging element of high integration density.

According to a production method of an infrared imaging device of the present invention, a plurality of grooves extending in the $[\overline{0}1\overline{1}]$ direction and having a V-shaped cross-section are produced on the surface of GaAs (100) substrate by etching, thereby producing a plurality of facets having an angle of $45 \pm 15$ degree with respect to the main face of substrate. Thereafter, a pin structure having an i layer of AlGaAs-QW structure which detects infrared rays of 8 to 12 microns wavelength band is produced on the plurality of facets by conducting an epitaxial growth by MBE method or MOCVD method. Therefore, a GaAs-MQW structure highly parallelized along the facets can be produced, and an element structure realizing incidence of infrared rays from the front surface or the rear surface of substrate can be produced.

DETAILED DESCRIPTION OF THE PREFERRED EMBODIMENTS

An embodiment of the present invention will be described in detail with reference to the drawings.

Figure 1A:
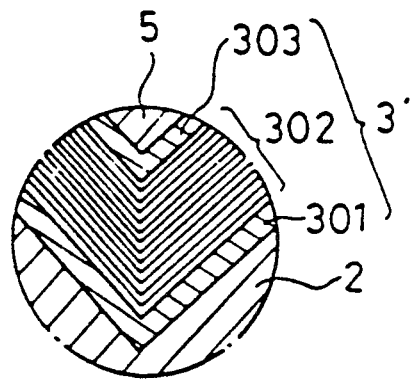
FIGS. 1(a) and (b) are cross-sectional views of a photovoltaic type infrared detector element of an infrared imaging device according to a first embodiment of the present invention.
Figure 1B:
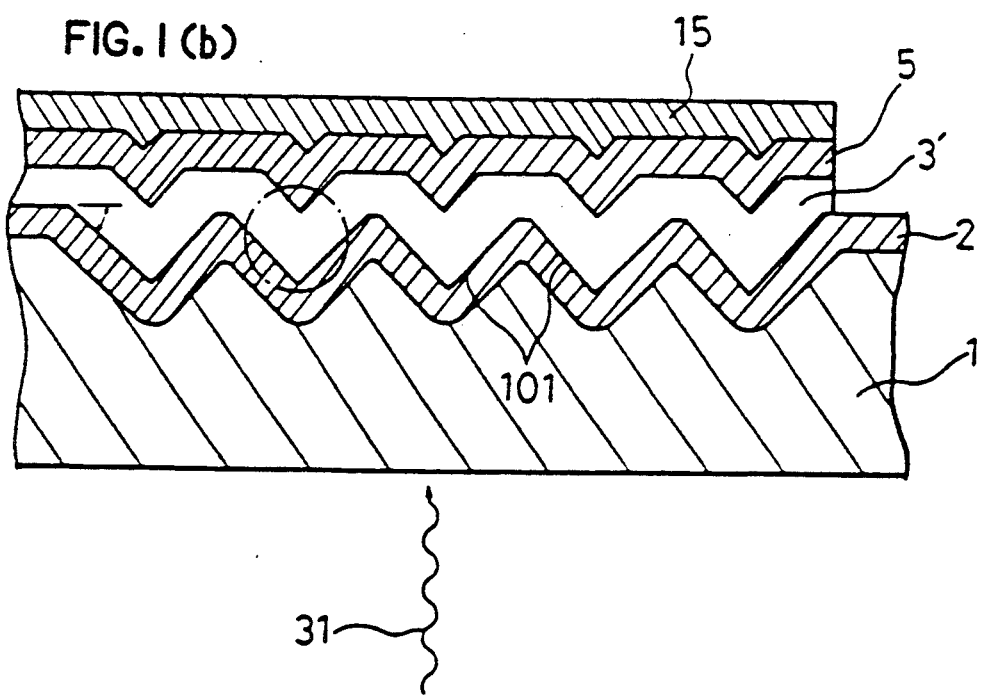

FIGS. 1(a) and (b) show cross-sections of an infrared detector portion of an infrared imaging device according to a first embodiment of the present invention. In FIG. 1(b), reference numeral 1 designates a semi-insulating GaAs substrate. A plurality of diagonal faces 101 (hereinafter referred to as "facets") having an angle of 45 degree with respect to the face of substrate 1 are produced on the semi-insulating GaAs substrate 1. An n+ type GaAs layer 2 is produced by ion implanting n type impurities into the GaAs substrate 1 having facets 101. A pin structure portion 3' including a GaAs-AlGaAs MQW structure is produced on the facets 101 by an epitaxial growth method such as MBE or MOCVD method. A p+ type GaAs ohmic layer 5 is epitaxially grown on the pin structure portion 3'. A p+ type ohmic electrode 15 is produced on the p+ type GaAs ohmic layer 5. Reference numeral 31 designates an infrared rays of 8 to 12 microns wavelength.

FIG. 1(a) shows an enlarged view of pin structure portion 3' of FIG. 1(b). In FIG. 1(a), reference numeral 302 designates an MQW layer comprising GaAs layer of 40 angstroms and $Al_{0.3}Ga_{0.7}As$ layer of 300 angstroms alternately laminated for fifty periods. This MQW layer 302 is put between by an n type $Al_{0.3}Ga_{0.7}As$ layer 301 and a p type $Al_{0.3}Ga_{0.7}As$ layer 303.

FIGS. 2(a) to (d) show main process steps for producing the infrared detection portion of FIG. 1. In FIG. 2, reference numeral 1a designates a (100) main face of semiconductor substrate 1. Reference numeral 20 designates a mask comprising $Si_3N_4$.

Figure 2A:
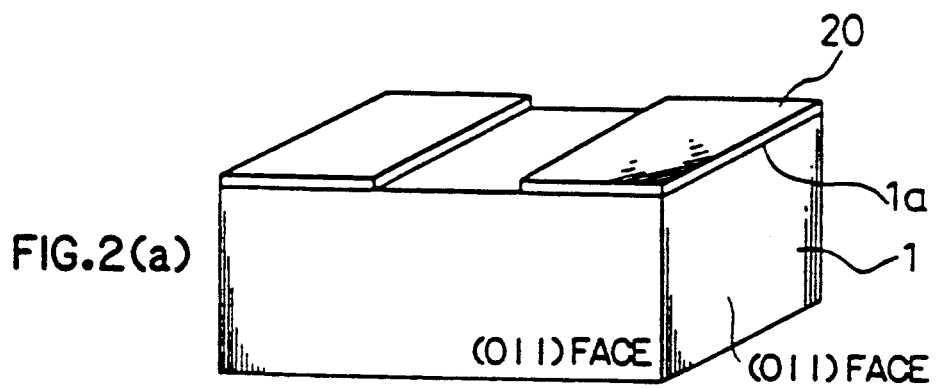
FIGS. 2(a) to (d) are diagrams showing main process steps of a crystal growth process required to produce infrared detector element of FIG. 1.

First of all, as shown in FIG. 2(a), $Si_3N_4$ is deposited to about 0.2 microns on the (100) main face 1a of semi-insulating GaAs substrate 1 by CVD method. Thereafter, this $Si_3N_4$ film is photolithographed and plasma etched, thereby producing a mask 20 having a window opened in stripe configuration of 10 micron width in [011] direction.

Figure 2B:
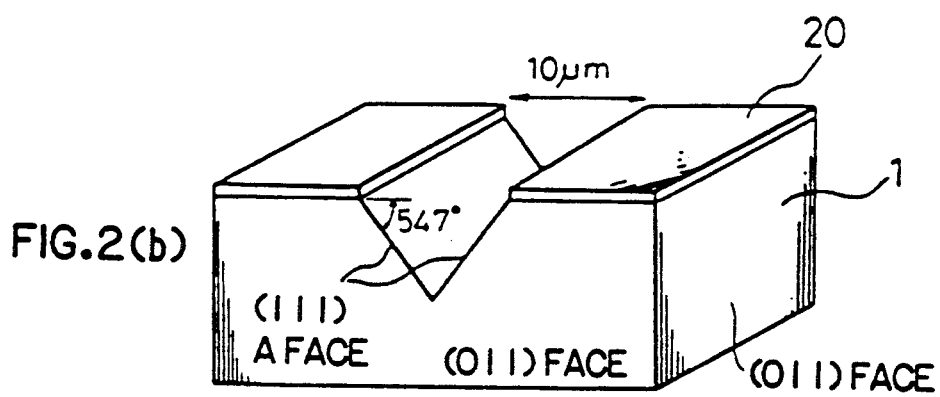

Next, as shown in FIG. 2(b), the GaAs substrate 1 is etched by sulfric series acid etchant having a ratio of 5:1:1 for $H_2SO_4:H_2O_2:H_2O$, thereby producing a V-shaped groove. The side face of this groove becomes [111]A face, and the side face has an angle of 54.7 degree with respect to the (100) main face.

Figure 2C:
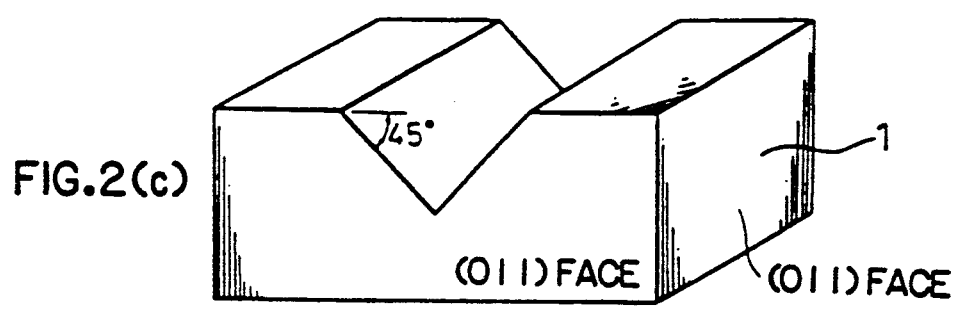

Next, as shown in FIG. 2(c), the remaining $Si_3N_4$ film 20 is removed, and the wafer is put in the crystal growth apparatus. The configuration of groove transforms by heated before the crystal growth, thereby producing a flat side face having an angle of 45±15 degree with respect to the (100) main face.

Figure 2D:
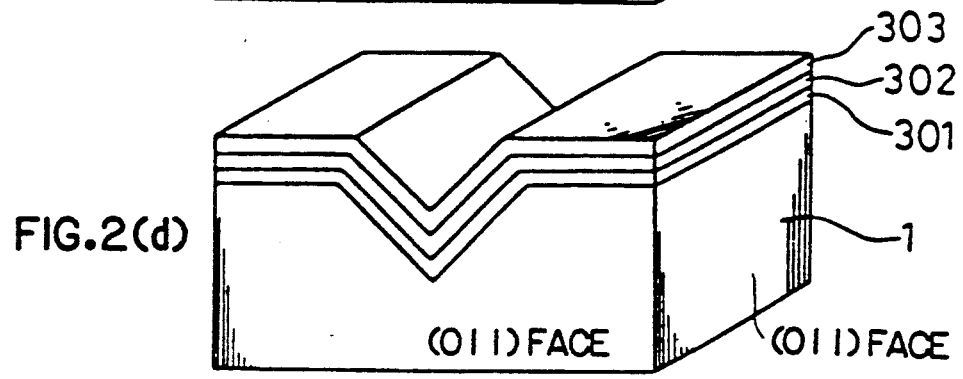

As shown in FIG. 2(d), an n type $Al_{0.3}Ga_{0.7}As$ layer 301, a layer of MQW structure 302 which is produced by alternately laminating an $Al_{0.3}Ga_{0.7}As$ layer of 300 angstroms thickness and a GaAs layer of 40 microns thickness for fifty periods, and a p type $Al_{0.3}Ga_{0.7}As$ layer 303 are successively grown by MOCVD method with using TMG, $AsH_3$, and TMA1 as material gas under conditions of 0.1 atm. and a temperature of 750° C. such that these three layers are grown at the same speed on the (100) main face and on the [111]A face in parallel with the face of substrate 1. In this method, even when quite a thin layer is included in the growth layer such as MQW structure 302, the respective layers are produced at a high degree of parallelization without causing an abnormal growth.

An MBE method may be used to grow the respective layers. In this case, by setting the growth conditions to $10^{-10}$ Torr, As:Ga=10:1, and substrate heating temperature of 600° C., highly parallelized growth layers can be obtained.

The device will operate a follows.

Figure 3:
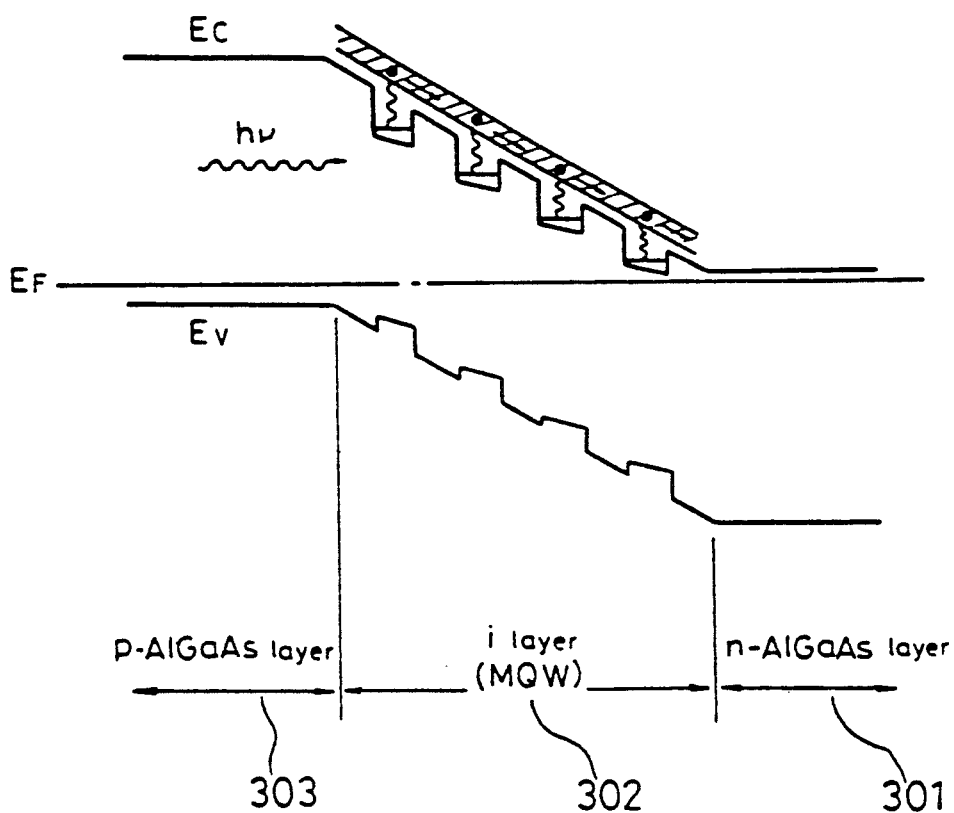
FIG. 3 is an energy band diagram for explaining an operation principle of a pin type photo-voltaic element of infrared imaging device according to the first embodiment of the present invention.

FIG. 3 shows an energy band diagram of a pin photovoltaic type infrared detector element according to the present invention. When infrared rays is incident to the device, electrons at the ground state of n=1 of quantum well optically transit to the excited state of n=2, and the exited electrons move toward the n type AlGaAs layer 301 by the electric field applied to the i layer comprising a MQW layer 302. Then, a photo-induced voltage arises in the photodiode, and a light current flows.

As described above, since a pin photodiode is produced to be highly parallelized on the facets having an angle of 45±15 degree with respect to the main face of GaAs substrate 1, infrared rays can be incident from the main face or rear face of semiconductor. Furthermore, since the infrared detector element is a photovoltaic type element of pin structure, the matching with the infrared imaging circuit can be accomplished.

Figure 4:
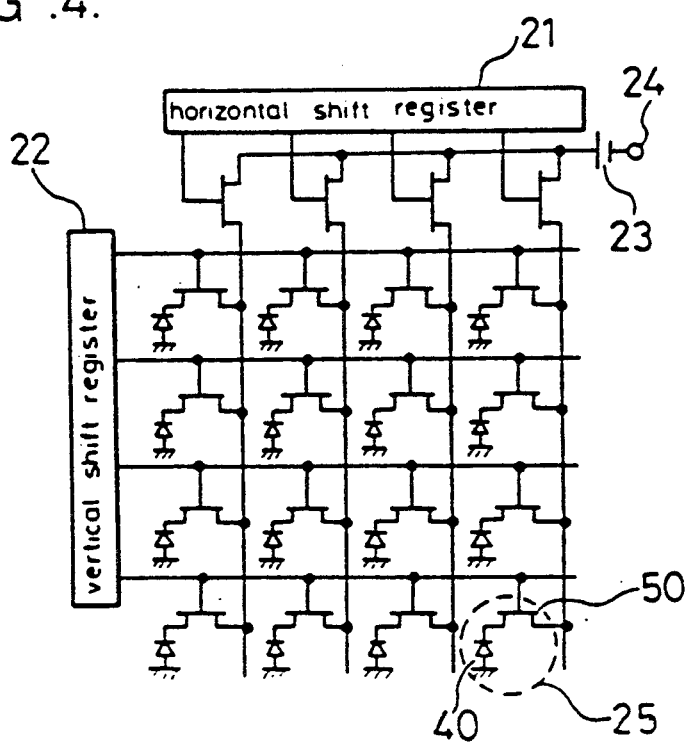
FIG. 4 is a diagram showing a circuit construction of infrared imaging device according to the first embodiment of the present invention.

The construction of an infrared imaging device utilizing the above-described pin structure photo-voltaic element is shown in FIG. 4. In FIG. 4, reference numeral 21 designates a horizontal direction shift register. Reference numeral 22 designates a vertical direction shift register. Reference numeral 23 designates a battery. Reference numeral 24 designates a signal output terminal. Reference numeral 25 designates a picture element. Reference numeral 40 designates a pin photodiode. Reference numeral 50 designates a GaAs MESFET.

A picture element 25 is constituted by a pin photodiode 40 and a GaAs MESFET 50, and carriers generated by the incidence of infrared rays are stored at the pin photodiode 40, and the information of respective picture element are successively read out with utilizing the GaAs FET 50 as a switching transistor, wherebY a picture image of infrared rays is obtained.

Figure 5:
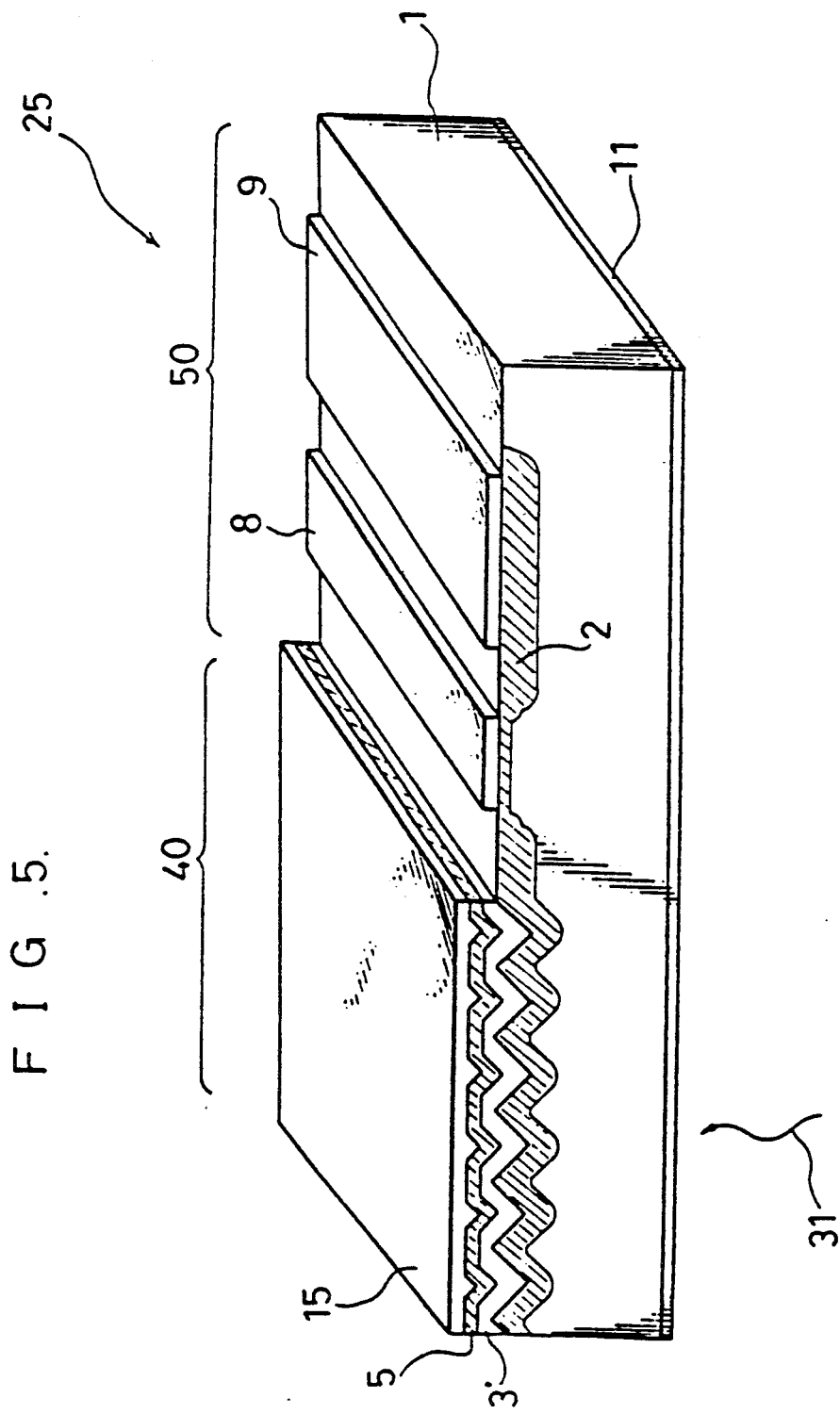
FIG. 5 is a diagram showing a construction of a picture element of infrared imaging device of the first embodiment in which a pin photodiode and a GaAs FET are integrated with each other.

FIG. 5 shows a construction of a picture element 25 in which the pin photodiode 40 and the GaAs MESFET 50 are integrated. In FIG. 5, the same reference numerals designate the same elements as shown in FIG. 1. An n type ion implantation layer 2 is produced at the surface region of semi-insulating GaAs substrate 1. A Schottky contact type gate electrode 8 and an ohmic drain electrode 9 are produced on the substrate 1. An anti-reflection film 11 is produced on the rear surface of substrate 1.

The production process will be described.

Figure 6:
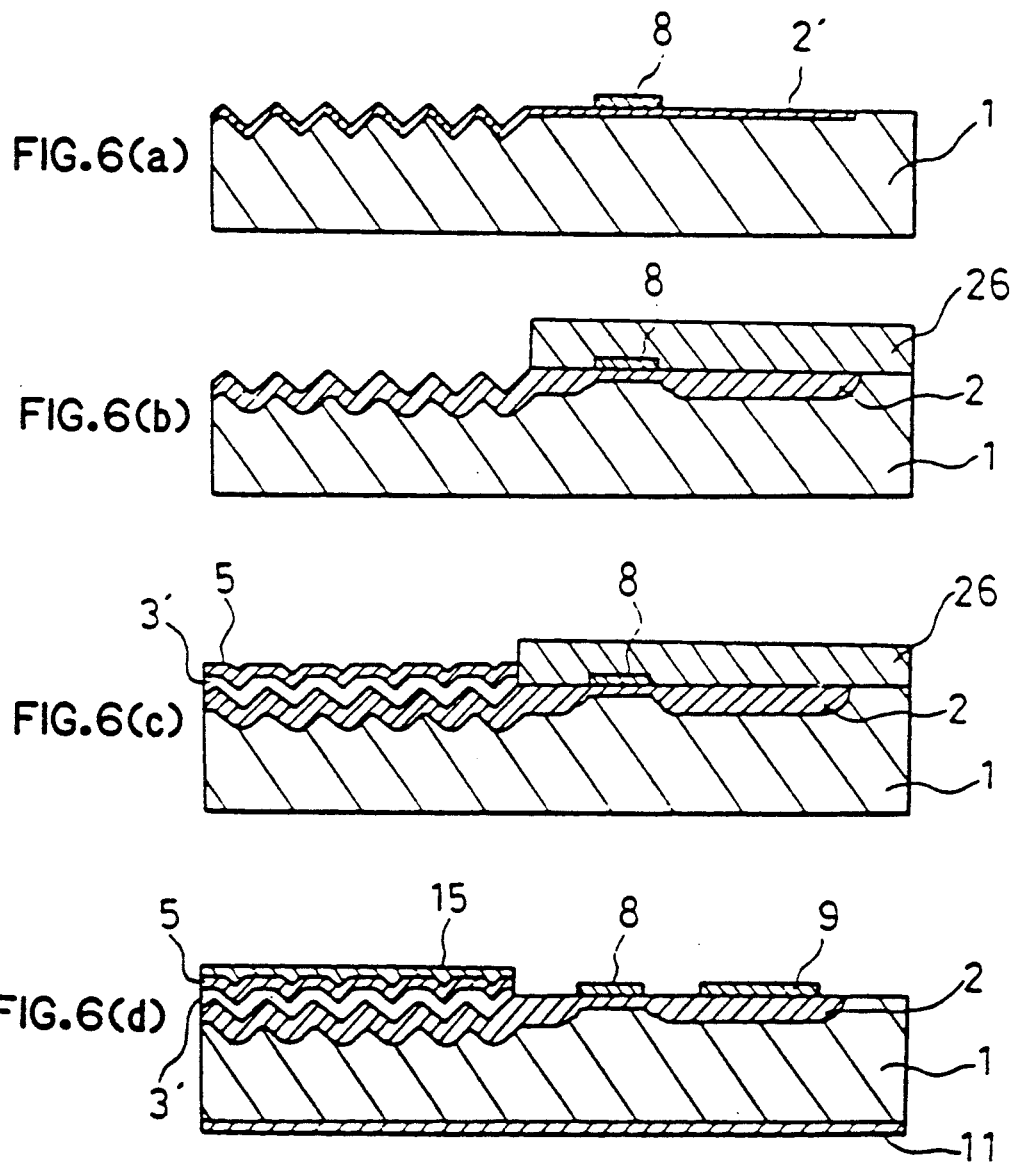
FIGS. 6(a) to (d) are diagrams showing main process steps for producing an infrared detector element in which a pin photodiode and a GaAs FET are integrated with each other.

First of all, as shown in FIG. 6(a), a V shaped groove having a side face of [111]A face is produced at a portion where a pin photodiode 40 will be produced on the (100) main surface of semi-insulating GaAs substrate 1 of 0.5 mm thickness by the method shown in FIG. 2(a) and 2(b). Thereafter, Si ions are ion implanted into the entire surface of substrate, thereby producing an n type active layer 2' of 0.2 microns thickness, and a refractory metal such as tungsten silicide or metal such as Al or Au/Mo is vapor deposited to a thickness of about 0.5 microns on a predetermined portion where a GaAs FET 50 is produced, and a Schottky junction type gate electrode 8 is produced.

Next, side walls comprising an insulating film such as $SiO_2$ are produced at the both sides of gate electrode 8, and Si ions are implanted into the entire surface of substrate using the side walls as a mask, thereby producing an ion implantation layer 2. Thereafter, the side walls are removed, and an insulating film 26 is produced on a surface region of substrate except for the pin photodiode production portion 40, as shown in FIG. 6(b).

Thereafter, as shown in FIG. 6(c), a pin structure portion 3' comprising an n type $Al_{0.3}Ga_{0.7}As$ layer 301, a layer of MQW structure 302 which is produced by alternately laminating an $Al_{0.3}Ga_{0.7}As$ layer of 300 angstroms thickness and a GaAs layer of 40 microns thickness for fifty periods, and a p type $Al_{0.3}Ga_{0.7}As$ layer 303 and a p+ type GaAs layer 5 are successively grown to be highly parallelized by MOCVD method or MBE method, thereby producing the respective layers along the face of substrate 1.

Thereafter, as shown in FIG. 6(d), the insulating film 26 is removed, and a p type electrode 15 comprising such as Au/Ti is produced on the p+ type GaAs layer 5 as well as a drain electrode 9 comprising such as Au of 5000 angstroms, Au-Ge of 1000 angstroms, and Ni of 200 angstroms is produced at a predetermined portion on the n type active layer 2 of GaAs FET production portion 50. Thereafter, an annealing is conducted to produce an ohmic contact electrode. Then, an anti-reflection film 11 comprising such as ZnSe having a thickness of $\lambda/4 \cdot n$ (where n is refractive index), that is, having a minimum reflectance is produced at the rear surface of substrate 1.

In such construction, since the n+ GaAs layer of pin photodiode 40 is connected to the source of GaAs FET 50 by the n type ion implantation layer 2, a source electrode is not required.

When a picture element integrated in such a manner is operated in a circuit construction shown in FIG. 4 as an infrared imaging device, the pin photodiode is reversely biased to be operated at low temperature. When the electrons of MQW layer 302 are gone by the use for many hours, the absorption of light does not arise and the pin photovoltaic element does not operate. This problem can be solved by periodically initializing the cell 23 shown in FIG. 4 in a state where the cell 23 is connected in the reverse direction to that at usual operation to place the pin photodiode 40 in a forward biased state. Furthermore, the initialization can be also conducted by irradiating such as laser light to the pin photodiode and supplying electrons from the valence band to the conduction band.

In the embodiment of such construction, a picture element of an infrared imaging device comprises the pin photodiode having a MQW layer 302 as an i layer produced by conducting selective epitaxial growth on the semi-insulating GaAs substrate 1 and a GaAs FET produced adjacent thereto. Therefore, an infrared detection element and a driving circuit can be monolithically integrated on the GaAS substrate 1. Thus, the number of picture elements is increased and an infrared imaging device having a high resolution is obtained.

Figure 7:
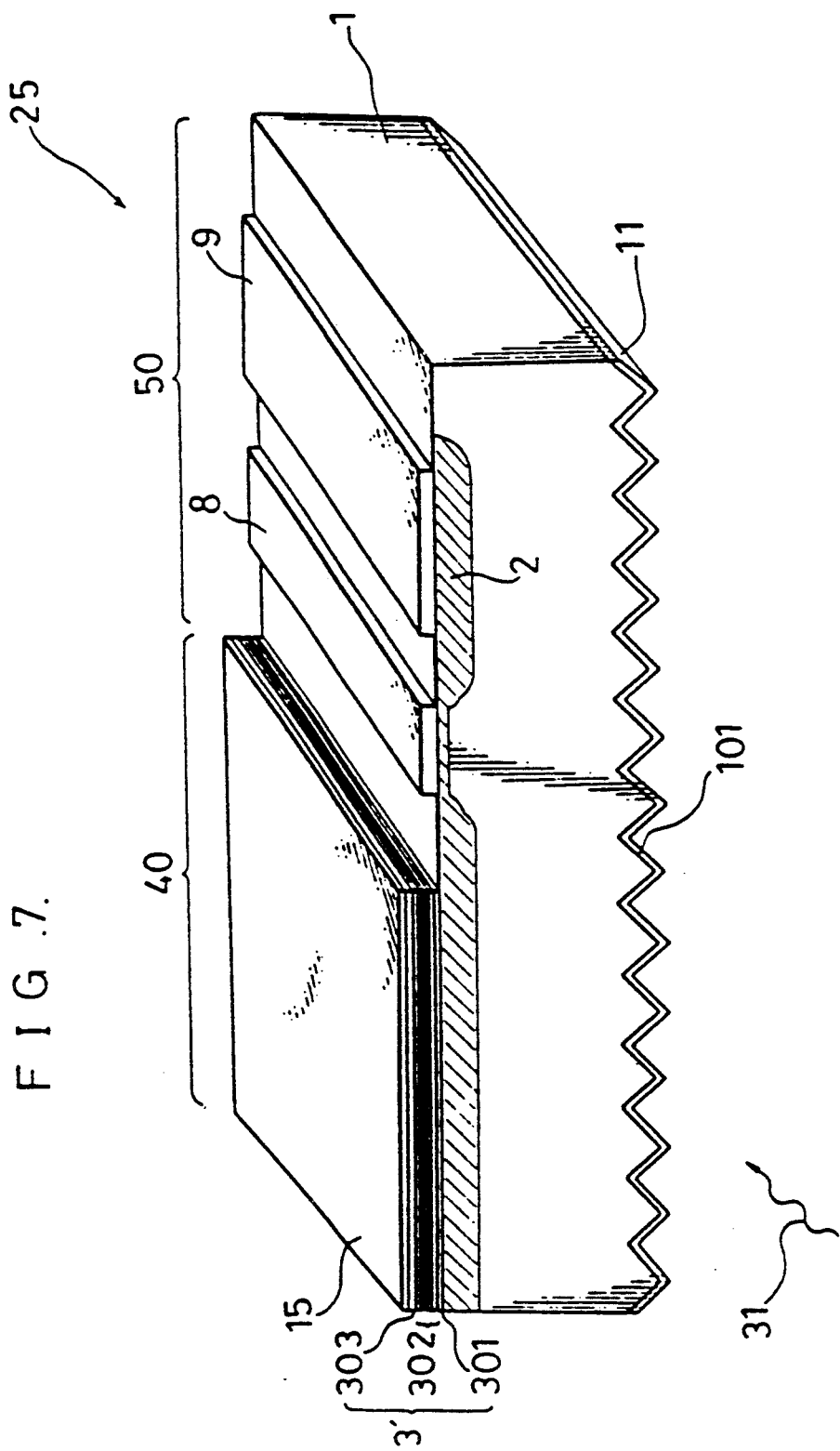
FIG. 7 is a diagram showing a construction of a picture element of an infrared imaging device according to a second embodiment of the present invention.
Figure 8:
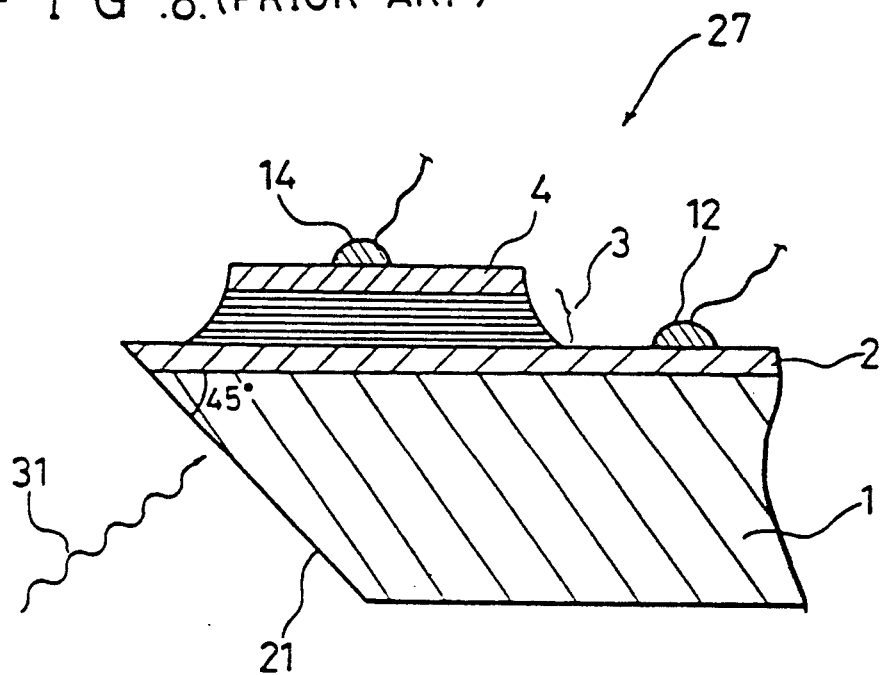
FIG. 8 is a diagram showing a cross-sectional view of a photo-conductivity type infrared detector using a multi-layer quantum well according to a prior art.
Figure 10:
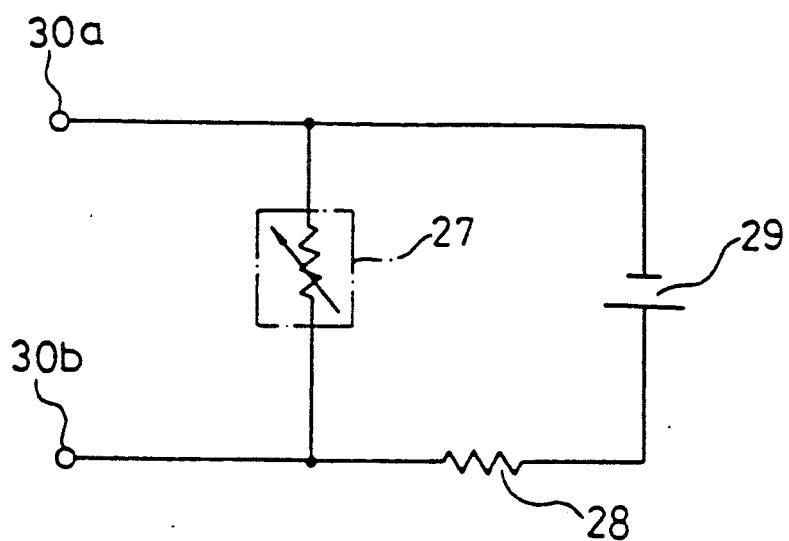
FIG. 10 is a diagram showing a brief construction of an imaging circuit constituted by using a prior art infrared detector element.
Figures 9A, 9B:
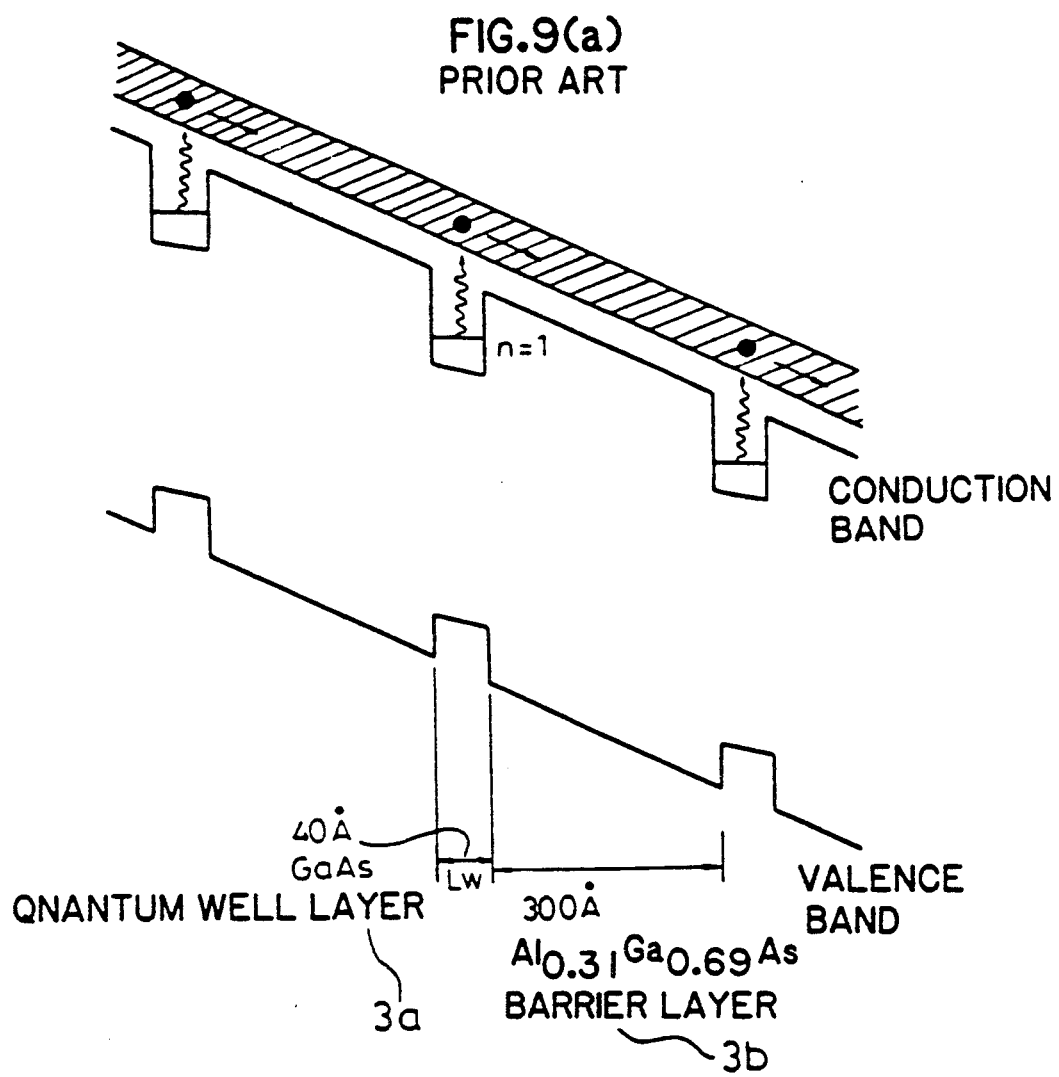
FIGS. 9a and 9b are energy band diagrams for explaining an operation principle of a prior art infrared detector element.

While in the above-illustrated embodiment an infrared imaging device in which a pin photodiode 40 is produced on a facet having an angle of $45 \pm 15$ degree with respect to the main surface of GaAs substrate 1 is described, another infrared imaging device in which a (101) facet having an angle of $45 \pm 15$ degree is produced at the rear surface of substrate and the infrared rays 31 is obliquely incident to the substrate as shown in FIG. 7 may be considered as a second embodiment of the present invention. In this device, since the light is incident to the MQW layer 302 at an angle of 45 degree similarly as in the above-described first embodiment, the light absorption effectively occurs with the same effects as described above.

While in the above-illustrated embodiment AlGaAs/GaAs series material is used as the III-V group compound semiconductor, other III-V group compound semiconductor such as InGaAsP/InP series material or InGaAlAs/InP series material may be used with the same effect as described above.

As is evident from the foregoing description, according to the present invention, a plurality of V-shaped facets having an angle of $45 \pm 15$ degree with respect to the main face of semi-insulating GaAs substrate is produced on the GaAs substrate, and an AlGaAs-MQW structure is produced thereon. Therefore, the infrared rays can be incident perpendicular to the device from the front or rear surface, thereby enabling to produce an imaging element of a high integration density.

Furthermore, a layer of AlGaAs-MQW structure is produced on the surface of semi-insulating GaAs substrate and a plurality of facets having an angle of $45 \pm 15$ degree with respect to the main face of substrate are produced on the rear surface of substrate. Therefore, the infrared rays can be obliquely incident to the device from the front surface or the rear surface, thereby enabling to produce an imaging element of a high integration density.

Furthermore, a pin photodiode having an i layer of AlGaAs-MQW structure and a GaAs FET having a source region connected with the n type layer of the pin photodiode are produced on a GaAs substrate, thereby constituting a picture element constituting an infrared imaging device. Therefore, the infrared detector element and the driving circuit can be monolithically integrated on the GaAs substrate, whereby an infrared imaging device for detecting infrared rays of 8 to 10 microns wavelength band having a plurality of picture elements and a high resolution can be obtained at low cost.

Furthermore, according to a production method of an infrared imaging device of the present invention, a plurality of grooves extending i n the $[\overline{0}11]$ direction and having a V-shaped cross-section are produced on the surface of GaAs (100) substrate by etching, thereby producing a plurality of facets having an angle of 45±15 degree with respect to the main surface of substrate, and a pin structure having an i layer of AlGaAs-MQW structure is produced on the plurality of facet faces by conducting an epitaxial growth by MBE method or MOCVD method. Therefore, a high parallelized MQW layer can be produced at high precision, and a structure of infrared detector element capable of conducting incidence of infrared rays vertical to the substrate can be obtained.

What is claimed is:

1. A production method for an infrared imaging device including:

etching a plurality of grooves extending in the $[\overline{0}11]$ direction and having V-shaped cross-sections on a compound semiconductor of [100] orientation, thereby providing a plurality of [111]A faces forming an angle of 45±15 degrees with respect to the surface of said substrate; and successively epitaxially growing an n type $Al_xGa_{1-x}As$ layer, a multi-quantum well structure comprising a plurality of $Al_yGa_{1-y}As$ quantum well layers sandwiched by respective type $Al_xGa_{1-x}As$ quantum barrier layers (x>y) and a p type $Al_xGa_{1-x}As$ layer on said plurality of faces.

2. A production method for an infrared imaging device as defined in claim 1
   including etching said plurality of grooves by producing an $Si_3N_4$ film having an aperture of 10 micron width on said (100) substrate;
   etching using said $Si_3N_4$ film as a mask;
   removing said $Si_3N_4$ layer; and
   producing V-shaped cross-sections having an angle of 45±15 degrees with respect to the surface of the (100) substrate.

3. A production method for an infrared imaging device as defined in claim 1, wherein said substrate is GaAs including etching said grooves with an etchant containing $H_2SO_4:H_2O_2:H_2O$ in a ratio of about 5:1:1.

4. A production method for an infrared imaging device as defined in claim 1 including epitaxially growing the n type, multi-quantum well, and p type layers by MOCVD at a pressure of about 0.1 atmospheres and a temperature of about 750° C.

5. A production method for an infrared imaging device as defined in claim 1 including alternately growing $Al_xGa_{1-x}As$ layers about 300 angstroms thick and $Al_yGa_{1-y}As$ layers about 40 angstroms thick as the multiquantum well structure.

6. A production method for an infrared imaging device as defined in claim 1, including growing the quantum well and quantum barrier layers with x about 0.3 and y about 0.

* * * * *